United States Patent
Ohno et al.

(10) Patent No.: US 7,825,012 B2
(45) Date of Patent: Nov. 2, 2010

(54) METHOD FOR MANUFACTURING NITRIDE SEMICONDUCTOR DEVICE

(75) Inventors: Akihito Ohno, Tokyo (JP); Masayoshi Takemi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/501,511

(22) Filed: Jul. 13, 2009

(65) Prior Publication Data

US 2010/0075483 A1  Mar. 25, 2010

(30) Foreign Application Priority Data

Sep. 24, 2008  (JP)  ............... 2008-243890
Apr. 21, 2009  (JP)  ............... 2009-103092

(51) Int. Cl.
H01L 21/20 (2006.01)
H01L 21/36 (2006.01)
H01L 21/00 (2006.01)

(52) U.S. Cl. .................. 438/479; 438/46; 438/47; 257/E21.09

(58) Field of Classification Search ........... 438/479, 438/47, 46, 32, 36, 41; 257/E21.09, E21.205
See application file for complete search history.

(56) References Cited

U.S. PATENT DOCUMENTS

| | | | |
|---|---|---|---|
| 5,740,192 A | 4/1998 | Hatano et al. | |
| 5,902,393 A | 5/1999 | Nido et al. | |
| 6,043,140 A | 3/2000 | Kawai et al. | |
| 6,284,042 B1 | 9/2001 | Sasaoka | |
| 6,508,879 B1 | 1/2003 | Hashimoto | |
| 6,617,235 B2 | 9/2003 | Iyechika et al. | |
| 2002/0026892 A1* | 3/2002 | Aoyagi et al. | ............... 117/19 |
| 2006/0138446 A1 | 6/2006 | Yoo et al. | |
| 2007/0025231 A1* | 2/2007 | Ochiai et al. | ............... 369/122 |
| 2009/0008659 A1 | 1/2009 | Ohno et al. | |

FOREIGN PATENT DOCUMENTS

| | | |
|---|---|---|
| JP | 6-232451 A | 8/1994 |
| JP | 8-56015 A | 2/1996 |
| JP | 8-316151 A | 11/1996 |
| JP | 8-325094 A | 12/1996 |
| JP | 9-199758 A | 7/1997 |

(Continued)

OTHER PUBLICATIONS

Hsu, Yu Jen, "Low Temperature metalorganic chemical vapor deposition of gallium nitride using dimethylhydrazine as nitrogen source", *Thin Solid Films*, 419:33-39 (2002).

(Continued)

*Primary Examiner*—Walter L Lindsay, Jr.
(74) *Attorney, Agent, or Firm*—Leydig, Voit & Mayer, Ltd.

(57) ABSTRACT

A method for manufacturing a nitride semiconductor device, includes forming a p-type nitride semiconductor layer on a substrate, from an organic metal compound as a group III element source material, ammonia and a hydrazine derivative as group V element source materials, and a Mg source material gas as a p-type impurity source material. The flow velocity of the source material gases including the group III element source material, the group V element source materials, and the p-type impurity source material is more than 0.2 m/sec.

12 Claims, 7 Drawing Sheets

FOREIGN PATENT DOCUMENTS

| | | |
|---|---|---|
| JP | 9-251957 A | 9/1997 |
| JP | 10-4211 A | 1/1998 |
| JP | 10-12554 A | 1/1998 |
| JP | 10-12555 A | 1/1998 |
| JP | 10-17400 A | 1/1998 |
| JP | 11-329981 A | 11/1999 |
| JP | 11-354456 A | 12/1999 |
| JP | 2000-164513 A | 6/2000 |
| JP | 2001-15437 A | 1/2001 |
| JP | 2001-144325 A | 5/2001 |
| JP | 2002-75879 A | 3/2002 |
| JP | 2002-231643 A | 8/2002 |
| JP | 2002-319743 A | 10/2002 |
| JP | 2003-178987 A | 6/2003 |

OTHER PUBLICATIONS

Park, Eun-Hyun, "As-grown p-type GaN growth by dimethylhydrazine nitrogen precursor", *J. of Crystal Growth*, 272 426-431 (2004).

* cited by examiner

METHOD FOR MANUFACTURING NITRIDE SEMICONDUCTOR DEVICE

BACKGROUND OF THE INVENTION

1. Field of the Invention

The present invention relates to a method for manufacturing a nitride semiconductor device using Mg as a p-type impurity, and particularly to a method for manufacturing a nitride semiconductor device having a p-type nitride semiconductor layer having good crystallinity, sufficiently low resistivity, and a Mg doping efficiency of more than 0.3%.

2. Background Art

In recent years, for the densification of optical disks, the research and development of semiconductor lasers that can emit light in the blue to ultraviolet regions have been actively performed. Such a blue-violet laser diode (hereinafter, a laser diode is described as an LD) has a nitride semiconductor device of GaN, GaPN, GaNAs, InGaN, AlGaN, AlGaInN, or the like. Nitride semiconductor devices having AlGaInN laminated structures have been already put to practical use.

As a method for manufacturing a nitride semiconductor device, after forming a p-type GaN layer using only ammonia as a group V raw material, forming a p-type GaN layer using only trimethylhydrazine as a group V raw material is proposed (for example, see Japanese Patent Laid-Open No. 2003-178987).

SUMMARY OF THE INVENTION

When ammonia ($NH_3$) is used as a V group raw material in forming the p-type GaN layer, H radicals produced from ammonia are taken into the p-type GaN layer. Then, there is a problem that H passivation in which the H radicals and the p-type impurity react with each other occurs, so that the activation rate of the p-type impurity decreases, and the resistivity of the p-type GaN layer increases. Then, if heat treatment is performed after crystal growth to activate the p-type impurity, the resistivity of the p-type GaN layer can be decreased. However, nitrogen (N) is eliminated from the surface of the p-type GaN layer by heat treatment, so that the crystal may deteriorate.

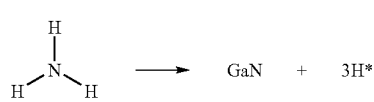
[Formula 1]

On the other hand, when dimethylhydrazine (UDMHy) is used as a V group raw material in forming the p-type GaN layer, $CH_3$ radicals are produced from dimethylhydrazine simultaneously with H radicals. These $CH_3$ radicals react with the H radicals to be released as $CH_4$, so that the H radicals can be prevented from being taken into the crystal.

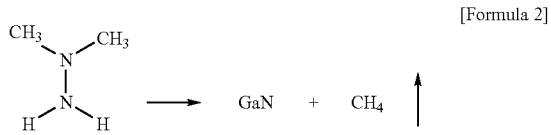
[Formula 2]

However, unless $CH_3$ radicals liberated from trimethylgallium (TMG), a group III raw material, are also released as $CH_4$, the $CH_3$ radicals are taken into the crystal, so that the carbon concentration increases. Then, carbon compensates the acceptor, so that the resistivity increases. However, when only dimethylhydrazine is used as the group V raw material, the amount of H radicals, which are required for producing $CH_4$ from $CH_3$ radicals, is insufficient. Therefore, there is a problem that the resistivity of the p-type GaN layer increases.

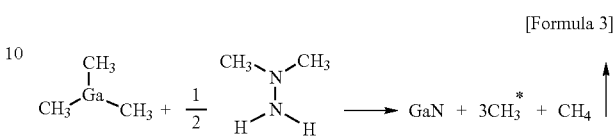
[Formula 3]

Also, the doping amount of the p-type nitride semiconductor layer should be at a practically sufficient level. For this, it is required that the Mg doping efficiency is more than 0.3% when Mg is used as the p-type impurity.

The present invention has been made to solve the problems as described above, and it is an object of the present invention to provide a method for manufacturing a nitride semiconductor device having a p-type nitride semiconductor layer having good crystallinity, sufficiently low resistivity, and a Mg doping efficiency of more than 0.3%.

According to one aspect of the present invention, a method for manufacturing a nitride semiconductor device, comprises the step of forming a p-type nitride semiconductor layer on a substrate, using an organic metal compound as a group III raw material, ammonia and a hydrazine derivative as a group V raw material, and a Mg raw material gas as a p-type impurity raw material, wherein in forming the p-type nitride semiconductor layer, a flow velocity of raw material gases comprising the group III raw material, the group V raw material, and the p-type impurity raw material is more than 0.2 m/sec.

According to the present invention, a nitride semiconductor device having a p-type nitride semiconductor layer having good crystallinity, sufficiently low resistivity, and a Mg doping efficiency of more than 0.3% can be manufactured.

Other and further objects, features and advantages of the invention will appear more fully from the following description.

DETAILED DESCRIPTION OF THE PREFERRED EMBODIMENTS

First Embodiment

Figure 1:
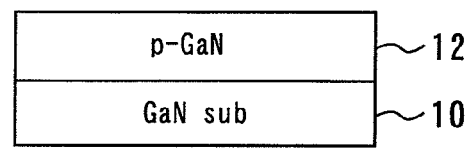
FIG. 1 is a cross-sectional view showing a nitride semiconductor device according to the First Embodiment of the present invention.

FIG. 1 is a cross-sectional view showing a nitride semiconductor device according to the First Embodiment of the present invention. This nitride semiconductor device has the laminated structure of, for example, a blue-violet LD. However, the nitride semiconductor device is not limited to an optical semiconductor device, such as a blue-violet LD, and may have the laminated structure of a general semiconductor device, for example, a transistor. A p-type GaN layer 12 (p-type nitride semiconductor layer) having a layer thickness of 1 μm is formed on the (0001) plane, major surface, of a GaN substrate 10 (substrate). The carbon concentration of the p-type GaN layer 12 is $1 \times 10^{18}$ cm$^{-3}$ or less.

Next, a method for manufacturing the nitride semiconductor laminated structure according to this Embodiment will be described. As the crystal growth method, an MOCVD method is used. As the group III raw material, trimethylgallium (TMG), an organic metal compound, is used. As the p-type impurity raw material, cyclopentadienyl magnesium (CP$_2$Mg) (a Mg raw material gas) is used. As the group V raw material, ammonia (NH$_3$) and 1,2-dimethylhydrazine (a hydrazine derivative) are used. As the carrier gas for these raw material gases, hydrogen (H$_2$) gas and nitrogen (N$_2$) gas are used.

Figure 2:
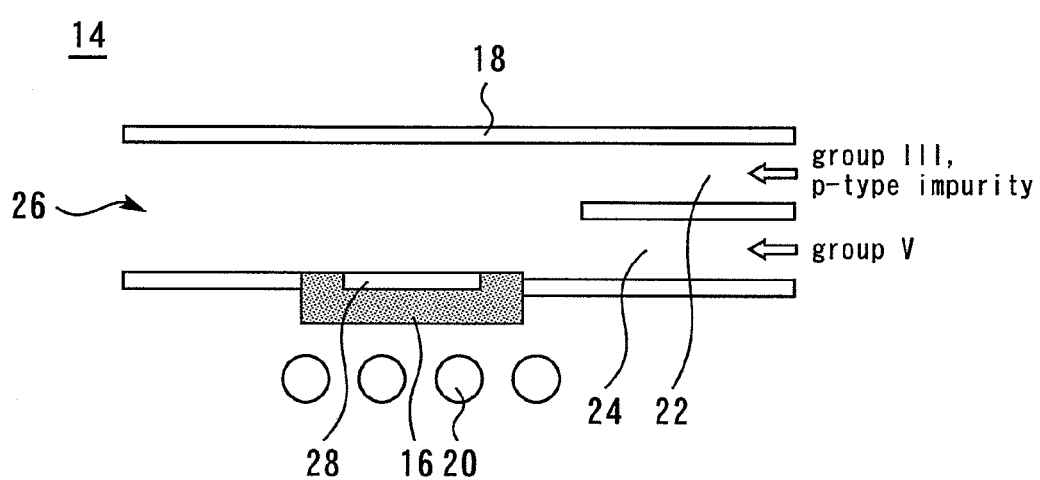
FIG. 2 shows an MOCVD apparatus for manufacturing the nitride semiconductor device according to the Embodiment of the present invention.

FIG. 2 shows an MOCVD apparatus for manufacturing the nitride semiconductor device according to the Embodiment of the present invention. An MOCVD apparatus 14 has a carbon susceptor 16, a quartz reaction tube 18, high-frequency coils 20, a first gas introduction portion 22, a second gas introduction portion 24, and an exhaust port 26. A substrate 28 is set in the susceptor 16 and placed in the reaction tube 18. The high-frequency coils 20 heat the substrate 28 via the susceptor 16. The first gas introduction portion 22 introduces the group III raw material, the p-type impurity raw material, and the carrier gas into the reaction tube 18, and the second gas introduction portion 24 introduces the group V raw material and the carrier gas. The exhaust port 26 exhausts these raw material gases from the reaction tube 18.

First, the GaN substrate 10 (substrate) whose major surface is a (0001) plane is placed in the reaction furnace of the MOCVD apparatus 14, and then, the temperature of the GaN substrate 10 is increased to 1000° C., while ammonia at a flow rate of $4.5 \times 10^{-1}$ mol/min and nitrogen gas at a flow rate of 20 l/min are fed.

Next, a gas mixture of nitrogen gas at a flow rate of 25 l/min and hydrogen gas at a flow rate of 2 l/min is fed as the carrier gas, and TMG at a flow rate of $8.9 \times 10^{-5}$ mol/min, ammonia at a flow rate of $4.5 \times 10^{-2}$ mol/min, 1,2-dimethylhydrazine at a flow rate of $5.6 \times 10^{-4}$ mol/min, and CP$_2$Mg at a flow rate of $2.3 \times 10^{-6}$ mol/min are fed. Thus, the p-type GaN layer 12 is formed on the major surface of the GaN substrate 10.

The flow velocity of the raw material gases comprising the group III raw material, the group V raw material, and the p-type impurity raw material, during the formation of the p-type GaN layer 12, is 0.25 m/sec. Here, the flow velocity of the raw material gases is calculated from the amount of the group III raw material gas, the group V raw material gas, and the carrier gas fed per unit time, the pressure in the reaction furnace, and the cross-sectional area of the reaction furnace. In order to change the flow velocity of the raw material gases, the amount of the carrier gas fed, and the pressure in the reaction furnace are changed.

Next, the feed of TMG and CP$_2$Mg is stopped, and cooling to about 300° C. is performed while the group V raw material is fed. Subsequently, the feed of the group V raw material is also stopped, and the temperature of the GaN substrate 10 is cooled to room temperature. When the feed of TMG and CP$_2$Mg is stopped, the feed of ammonia and 1,2-dimethylhydrazine, the group V raw material, may also be stopped. Also, the feed of ammonia may also be stopped, and cooling to about 300° C. may be performed while only 1,2-dimethylhydrazine is fed. Since 1,2-dimethylhydrazine is decomposed at a lower temperature than ammonia, the re-elimination of nitrogen from the crystal face is reduced, and the morphology of the surface is improved. The nitride semiconductor device according to this Embodiment is manufactured by the above steps.

When the Mg concentration was measured by SIMS (Secondary Ion Mass Spectrometry) analysis for the nitride semiconductor device of this Embodiment, the Mg concentration in the p-type GaN layer 12 was $9 \times 10^{19}$ cm$^{-3}$, and the Mg doping efficiency was 0.56%, which was a practically sufficient level. Here, the Mg doping efficiency is the ratio of Mg in the crystal to the amount of the Mg raw material gas fed.

Figure 3:
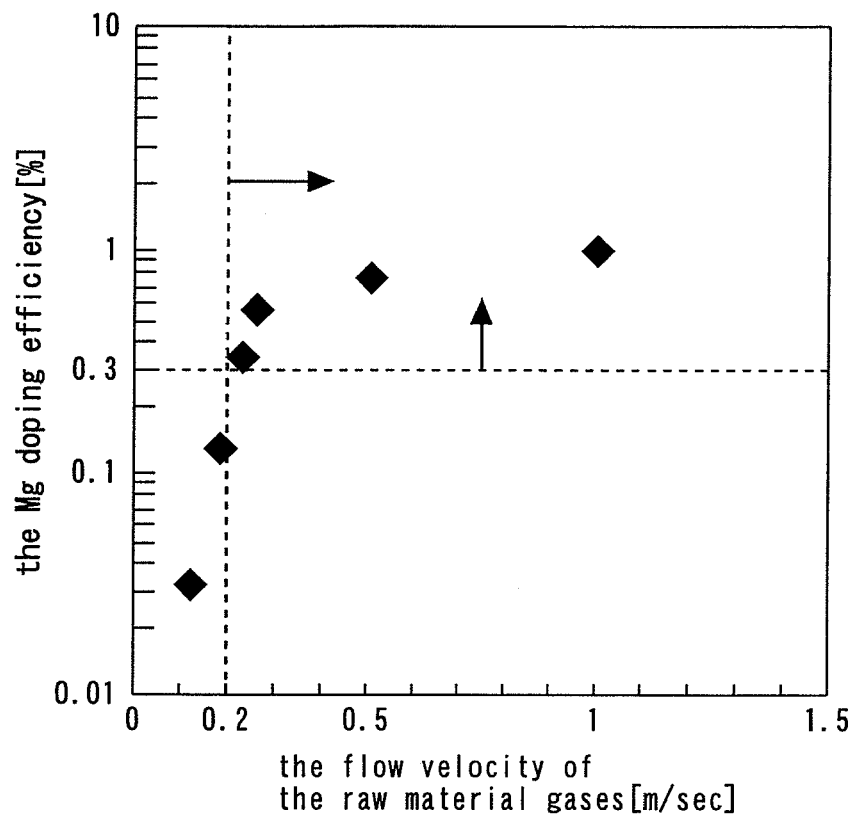
FIG. 3 is a diagram showing the relationship between the flow velocity of the raw material gases during the growth of the p-type GaN layer and the Mg doping efficiency of the p-type GaN layer.

FIG. 3 is a diagram showing the relationship between the flow velocity of the raw material gases during the growth of the p-type GaN layer and the Mg doping efficiency of the p-type GaN layer. It is seen that when the flow velocity of the raw material gases is slower than 0.25 m/sec, the doping efficiency decreases sharply. The doping efficiency, when the flow velocity is 0.17 m/sec, decreases to 0.13, which is not a practically sufficient level. It is considered that the Mg doping efficiency decreases sharply when the flow velocity is slow in this manner because 1,2-dimethylhydrazine, the group V raw material, and CP$_2$Mg, the p-type impurity raw material, react with each other in the gas phase, and are exhausted without being taken into the crystal. Therefore, by increasing the flow velocity of the raw material gases, the gas phase reaction can be suppressed. Specifically, when the flow velocity of the raw material gases is more than 0.2 m/sec, the Mg doping efficiency is more than 0.3%, and a doping amount at a practically sufficient level can be achieved.

If the flow velocity of the raw material gases is too high, the crystal growth efficiency decreases. In the case of this Embodiment, the flow velocity of the raw material gases is desirably less than 1.0 m/sec, and further desirably less than 0.5 m/sec.

Also, in the MOCVD apparatus in FIG. 2, CP$_2$Mg, the p-type impurity raw material, is introduced by the first gas introduction portion 22, and 1,2-dimethylhydrazine, the group V raw material, is introduced by the second gas introduction portion 24. In other words, the raw material gas comprising the group V raw material, and the raw material gas comprising the p-type impurity raw material are separately introduced up to near the GaN substrate 10. Thus, 1,2-dimethylhydrazine, the group V raw material, and CP$_2$Mg, the p-type impurity raw material, can be prevented from undergoing gas phase reaction before coming near the GaN substrate 10.

Also, in this Embodiment, the p-type GaN layer 12 is formed using ammonia and the hydrazine derivative as the group V raw material. $CH_3$ radicals are produced from the hydrazine derivative simultaneously with H radicals. These $CH_3$ radicals react with the H radicals to be released as $CH_4$, so that the H radicals can be prevented from being taken into the crystal.

When hole measurement was performed by the Van der Pauw method for the nitride semiconductor device of this Embodiment, the carrier (hole) concentration was $7.0 \times 10^{17}$ $cm^{-3}$ at room temperature, and the resistivity was 0.7 Ωcm. On the other hand, hole measurement was performed for a similar laminated structure obtained by using only ammonia as the V group raw material during the growth of the p-type GaN layer, but with the as-grown structure, the resistivity was high, and holes could not be measured. Then, heat treatment at about 900° C. was performed, and similar measurement was performed. As a result, the hole concentration was $7.0 \times 10^{17}$ $cm^{-3}$, and the resistivity was 1.0 Ωcm. Therefore, it was found that in this Embodiment, a resistivity of substantially equal to or less than 1.0 Ωcm can be achieved without performing heat treatment.

Also, $CH_3$ radicals liberated from TMG, the group III raw material, should be released as $CH_4$. However, when only dimethylhydrazine is used as the group V raw material, the amount of H radicals, which are required for producing $CH_4$ from $CH_3$ radicals, is insufficient. Then, in this Embodiment, a predetermined amount of ammonia is added to feed the amount of H radicals required for the production of $CH_4$. Thus, the carbon concentration of the p-type GaN layer 12 can be $1 \times 10^{18}$ $cm^{-3}$ or less. However, if the amount of H radicals is too large, H passivation occurs, so that the amount of $NH_3$ fed should be reduced to a minimum.

Figure 4:
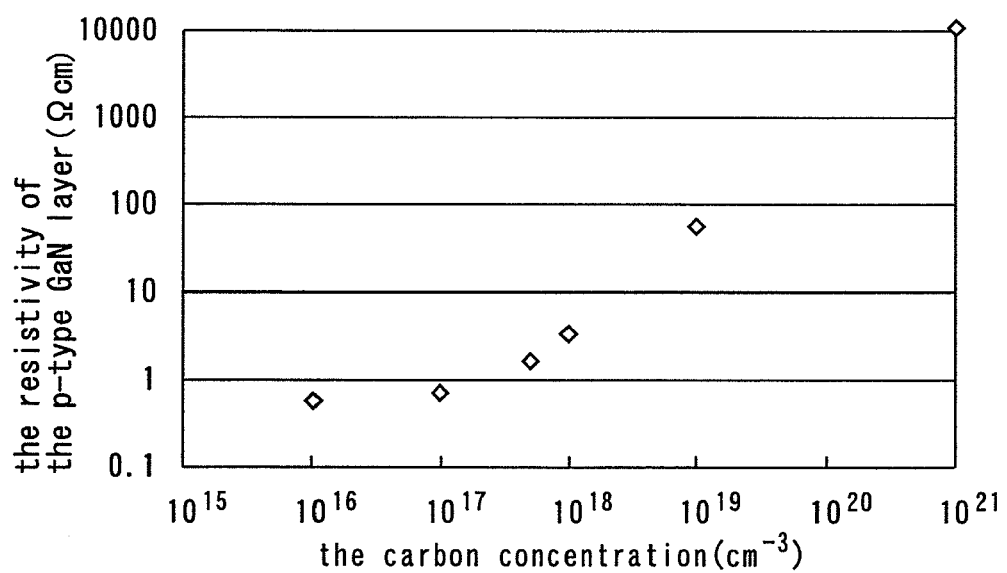
FIG. 4 is a diagram showing the dependence of the resistivity of the p-type GaN layer on the carbon concentration.

FIG. 4 is a diagram showing the dependence of the resistivity of the p-type GaN layer on the carbon concentration. $1 \times 10^{16}$ $cm^{-3}$ is the carbon detection limit. As is seen from this result, since the p-type GaN layer 12 has a carbon concentration of $1 \times 10^{18}$ $cm^{-3}$ or less, the p-type GaN layer 12 has sufficiently low resistivity to be used as a device.

As described above, the p-type nitride semiconductor layer having sufficiently low resistivity and a Mg doping efficiency of more than 0.3% can be formed by the method of this Embodiment. Also, heat treatment for activating the p-type impurity need not be performed after crystal growth, so that the crystallinity is good.

Also, when the p-type GaN layer 12 is formed, a gas mixture of hydrogen gas and nitrogen gas, in which the volume composition ratio of hydrogen gas is x ($0 \leq x \leq 1$) and the volume composition ratio of nitrogen gas is 1-x, is used as the carrier gas. In other words, the carrier gas used when the p-type layer is formed may be any of nitrogen gas alone, a gas mixture of nitrogen gas and hydrogen gas, and hydrogen gas alone. Here, when the temperature of the GaN substrate 10 is about 1000° C., hydrogen gas does not dissociate, is present as hydrogen molecules, and is not taken into the crystal. Therefore, H radicals taken into the crystal is considered to be mainly H radicals decomposed from $NH_3$, so that even when the carrier gas is hydrogen gas alone, the p-type GaN layer 12 having low resistivity can be formed.

For example, when a gas mixture in which hydrogen gas: nitrogen gas is 1:1 is used, nitrogen gas at a feed flow rate of 10 l/min and hydrogen gas at a feed flow rate of 10 l/min are mixed. When the carrier gas was a gas mixture in this manner, the surface morphology of the p-type GaN layer was better than that when the carrier gas was nitrogen gas alone. Also, as a result of performing hole measurement by the Van der Pauw method, at room temperature, the hole concentration was $5 \times 10^{17}$ $cm^{-3}$, and the resistivity was 0.9 Ωcm. Then, when heat treatment at 700° C. in a nitrogen gas atmosphere was performed, the hole concentration increased to $7 \times 10^{17}$ $cm^{-3}$, and the resistivity decreased to 0.6 Ωcm. It is considered that when additional heat treatment was performed in this manner, the resistivity was lower than that in the case of nitrogen gas alone, because by using the gas mixture, the surface flatness was improved, so that the crystallinity was improved.

Figure 5:
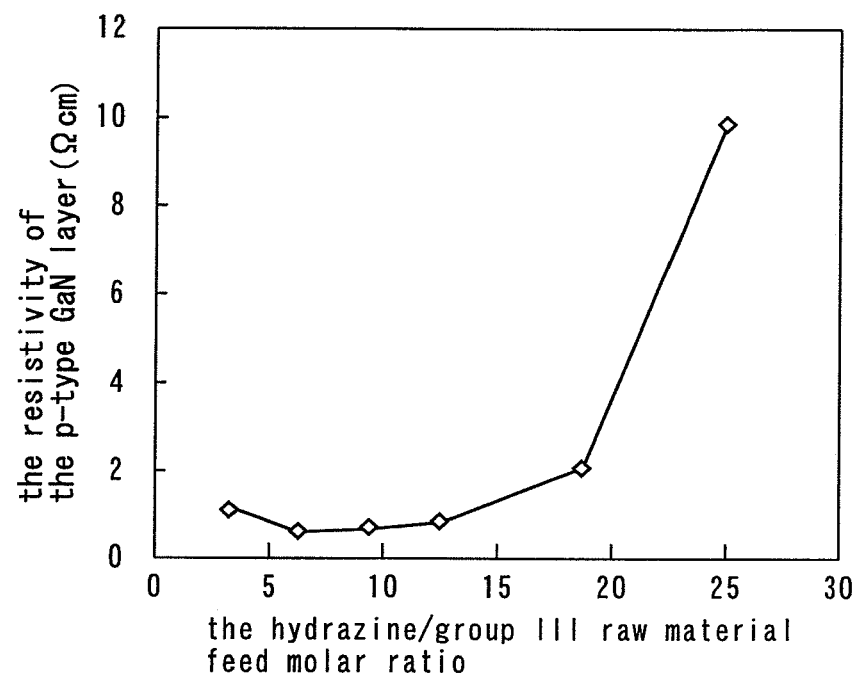
FIG. 5 is a diagram showing the dependence of the resistivity of the p-type GaN layer on the hydrazine/group III raw material feed molar ratio.

FIG. 5 is a diagram showing the dependence of the resistivity of the p-type GaN layer on the hydrazine/group III raw material feed molar ratio. The hydrazine/group III raw material feed molar ratio is the feed molar flow rate of hydrazine to the feed molar flow rate of the group III raw material. The temperature of the GaN substrate 10 was 1000° C. The $NH_3$/hydrazine feed molar ratio was 120. As the carrier gas, a gas in which nitrogen gas and hydrogen gas were mixed at a ratio of 1:1 was used. As a result, the resistivity increased sharply between hydrazine/group III raw material feed molar ratios of 20 and 25 because the concentration of carbon contained in the crystal increased. On the other hand, at a hydrazine/group III raw material feed molar ratio of less than 1, V group vacancy occurs in the crystal, causing crystal deterioration. Therefore, when the p-type GaN layer 12 is formed, the feed molar ratio of the hydrazine derivative to the organic metal compound is desirably 1 or more and less than 20, and further desirably 3 or more and 15 or less.

Figure 6:
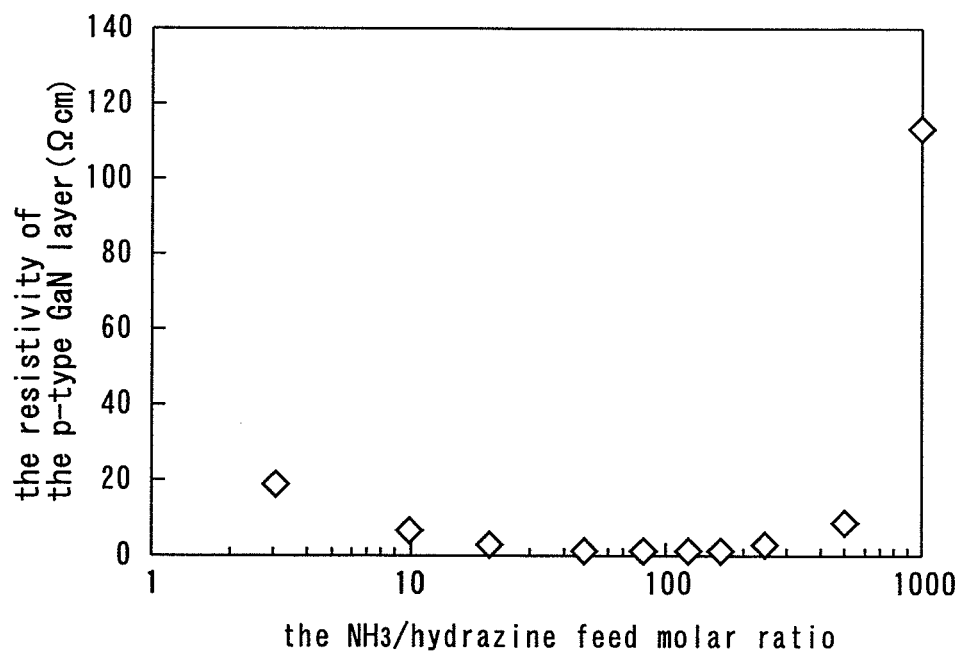
FIG. 6 is a diagram showing the dependence of the resistivity of the p-type GaN layer on the $NH_3$/hydrazine feed molar ratio.

FIG. 6 is a diagram showing the dependence of the resistivity of the p-type GaN layer on the $NH_3$/hydrazine feed molar ratio. The $NH_3$/hydrazine feed molar ratio is the feed molar flow rate of $NH_3$ to the feed molar flow rate of hydrazine. The temperature of the GaN substrate 10 was 1000° C. The feed molar flow rate of hydrazine to the feed molar flow rate of the group III raw material was 9.4. As the carrier gas, a gas in which nitrogen gas and hydrogen gas were mixed at 1:1 was used. As a result, when the $NH_3$/hydrazine feed molar ratio was 10 or less, the feed of H radicals was insufficient, and the carbon concentration in the crystal increased, so that the resistivity increased. On the other hand, the resistivity increased sharply between $NH_3$/hydrazine feed molar ratios of 500 and 1000 because H was taken into the crystal by the feed of excessive $NH_3$, so that H passivation occurred. Therefore, when the p-type GaN layer 12 is formed, the feed molar ratio of ammonia to the hydrazine derivative is desirably 10 or more and less than 1000, and further desirably 20 or more and 500 or less.

Figure 7:
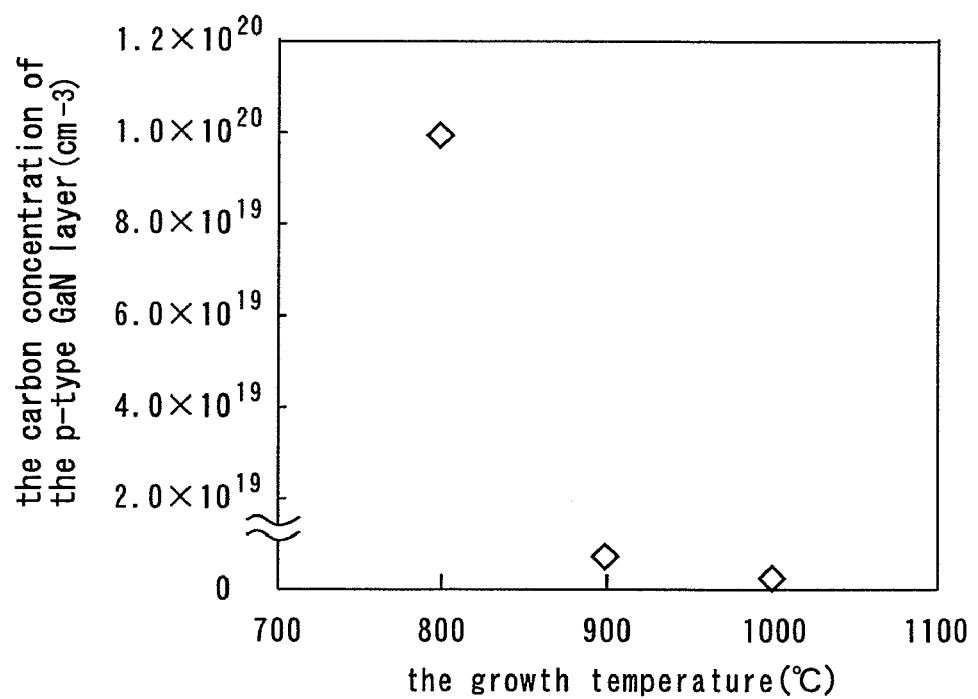
FIG. 7 is a diagram showing the dependence of the carbon concentration of the p-type GaN layer on the growth temperature.

FIG. 7 is a diagram showing the dependence of the carbon concentration of the p-type GaN layer on the growth temperature. The growth temperature is the same as the temperature of the substrate. The hydrazine/group III raw material feed molar ratio was 9.4. The $NH_3$/hydrazine feed molar ratio was 120. As the carrier gas, a gas in which nitrogen gas and hydrogen gas were mixed at a ratio of 1:1 was used. As a result, the carbon concentration in the crystal decreased sharply at 800° C. to 900° C. Also, it is considered that when the growth temperature decreases, the decomposition of $NH_3$ is reduced, so that $CH_3$ radicals do not become $CH_4$ to be released, and are taken into the crystal. On the other hand, the temperature at which the p-type GaN crystal growth is possible is less than 1200° C. Therefore, when the p-type GaN layer 12 is formed, the temperature of the GaN substrate 10 is desirably 800° C. or more and less than 1200° C., and further desirably 900° C. or more and less than 1200° C.

Figure 8:
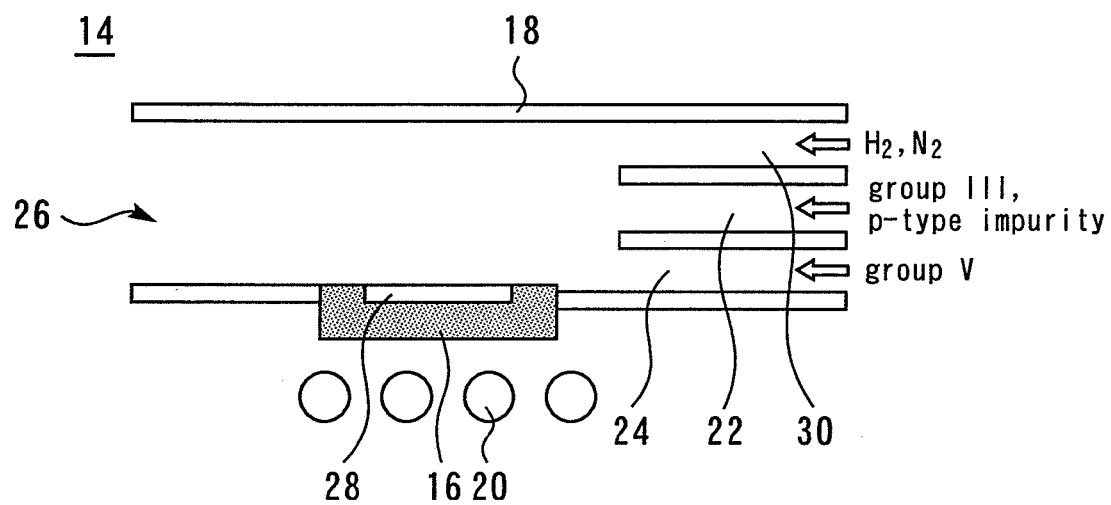
FIG. 8 shows a modification of the MOCVD apparatus.

FIG. 8 shows a modification of the MOCVD apparatus. This MOCVD apparatus further has a third gas introduction portion 30 provided on the first gas introduction portion 22 and the second gas introduction portion 24. The first gas introduction portion 22 introduces the group III raw material and the p-type impurity raw material into the reaction tube 18. The second gas introduction portion 24 introduces the group V raw material. The third gas introduction portion 30 introduces the carrier gas. The upward convection of the raw material gases can be suppressed by the carrier gas introduced from this third gas introduction portion 30.

Second Embodiment

Figure 9:
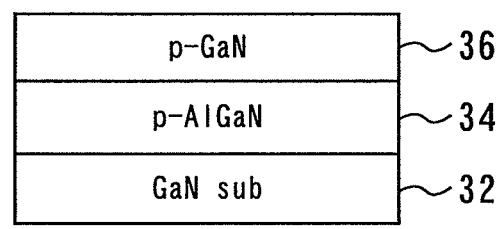
FIG. 9 is a cross-sectional view showing a nitride semiconductor device according to the Second Embodiment of the present invention.

FIG. 9 is a cross-sectional view showing a nitride semiconductor device according to the Second Embodiment of the present invention. This nitride semiconductor device has the laminated structure of, for example, a blue-violet LD. However, the nitride semiconductor device is not limited to an optical semiconductor device, such as a blue-violet LD, and may have the laminated structure of a general semiconductor device, for example, a transistor.

A p-type $Al_{0.07}Ga_{0.93}N$ layer 34 (first p-type nitride semiconductor layer) having a layer thickness of 1 μm is formed on the (0001) plane, major surface, of a GaN substrate 32 (substrate). A p-type GaN layer 36 (second p-type nitride semiconductor layer) having a layer thickness of 0.02 μm is formed on this p-type $Al_{0.07}Ga_{0.93}N$ layer 34. The hydrogen concentration in the p-type $Al_{0.07}Ga_{0.93}N$ layer 34 is $1\times10^{19}$ $cm^{-3}$ or less, and the carbon concentration of the p-type GaN layer 36 is $1\times10^{18}$ $cm^{-3}$ or less.

Next, a method for manufacturing the nitride semiconductor device according to this Embodiment will be described. As the crystal growth method, an MOCVD method is used. As the group III raw material, trimethylgallium (TMG) and trimethylaluminum (TMA), organic metal compounds, are used. As the p-type impurity raw material, cyclopentadienyl magnesium ($CP_2Mg$) is used. As the group V raw material, ammonia ($NH_3$) and 1,2-dimethylhydrazine (a hydrazine derivative) are used. As the carrier gas for these raw material gases, hydrogen ($H_2$) gas and nitrogen ($N_2$) gas are used.

First, the GaN substrate 32 is placed in the reaction furnace of the MOCVD apparatus 14 in FIG. 2 or FIG. 8, and then, the temperature of the GaN substrate 32 is increased to 1000° C., while ammonia at a flow rate of $4.5\times10^{-1}$ mol/min and nitrogen gas at a flow rate of 20 l/min are fed.

Next, TMG at a flow rate of $2.4\times10^{-4}$ mol/min, TMA at a flow rate of $1.4\times10^{-5}$ mol/min, and $CP_2Mg$ at a flow rate of $3.0\times10^{-7}$ mol/min are fed in addition to nitrogen gas and ammonia. Thus, the p-type $Al_{0.07}Ga_{0.93}N$ layer 34 is formed on the major surface of the GaN substrate 32.

Next, the feed of TMA is stopped, and 1,2-dimethylhydrazine at a flow rate of $5.6\times10^{-4}$ mol/min is fed with the carrier gas, in addition to TMG at a flow rate of $1.2\times10^{-4}$ mol/min, $CP_2Mg$ at a flow rate of $9.0\times10^{-7}$ mol/min, and ammonia at $4.5\times10^{-2}$ mol/min as the group V raw material. Thus, the p-type GaN layer 36 is formed on the p-type $Al_{0.07}Ga_{0.93}N$ layer 34. The growth time at this time is 5 min. Also, the flow velocity of the raw material gases comprising the group III raw material, the group V raw material, and the p-type impurity raw material, during the formation of the p-type GaN layer 36, is 0.25 m/sec.

Next, the feed of TMG and $CP_2Mg$ is stopped, and cooling to about 300° C. is performed while the group V raw material is fed. Subsequently, the feed of the group V raw material is also stopped, and the temperature of the GaN substrate 32 is cooled to room temperature. When the feed of TMG and $CP_2Mg$ is stopped, the feed of ammonia may also be stopped, and cooling to about 300° C. may be performed while only 1,2-dimethylhydrazine is fed. Since 1,2-dimethylhydrazine is decomposed at a lower temperature than ammonia, the re-elimination of nitrogen from the crystal face is reduced, and the morphology of the surface is improved. The nitride semiconductor device according to this Embodiment is manufactured by the above steps.

The feature of this Embodiment is to form the p-type $Al_{0.07}Ga_{0.93}N$ layer 34, using only ammonia as the group V raw material. In other words, since carbon easily enters a layer containing Al, the hydrazine derivative containing carbon is not used during the growth of the p-type $Al_{0.07}Ga_{0.93}N$ layer 34. However, when only the p-type AlGaN layer was grown on the substrate, and SIMS analysis was performed, the hydrogen concentration was $2.0\times10^{19}$ $cm^{-3}$, which was substantially equal to the Mg concentration. On the other hand, in this Embodiment, the hydrogen concentration of the p-type $Al_{0.07}Ga_{0.93}N$ layer 34 is $1\times10^{19}$ $cm^{-3}$ or less. The hydrogen concentration can be suppressed in this manner because hydrogen being taken into the p-type $Al_{0.07}Ga_{0.93}N$ layer 34 can be prevented during the growth of the p-type GaN layer 36.

If the hydrogen concentration in the p-type $Al_{0.07}Ga_{0.93}N$ layer 34 is high, H passivation in which the H radicals and the p-type impurity react with each other occurs, so that the activation rate of the p-type impurity decreases. Then, when heat treatment is performed to activate the p-type impurity, nitrogen (N) is eliminated from the surface of the p-type semiconductor layer, so that the crystal deteriorates. On the other hand, the p-type $Al_{0.07}Ga_{0.93}N$ layer 34 has a hydrogen concentration of $1\times10^{19}$ $cm^{-3}$ or less, so that the p-type $Al_{0.07}Ga_{0.93}N$ layer 34 has sufficiently low resistivity, does not require heat treatment, and has good crystalliny.

Figure 10:
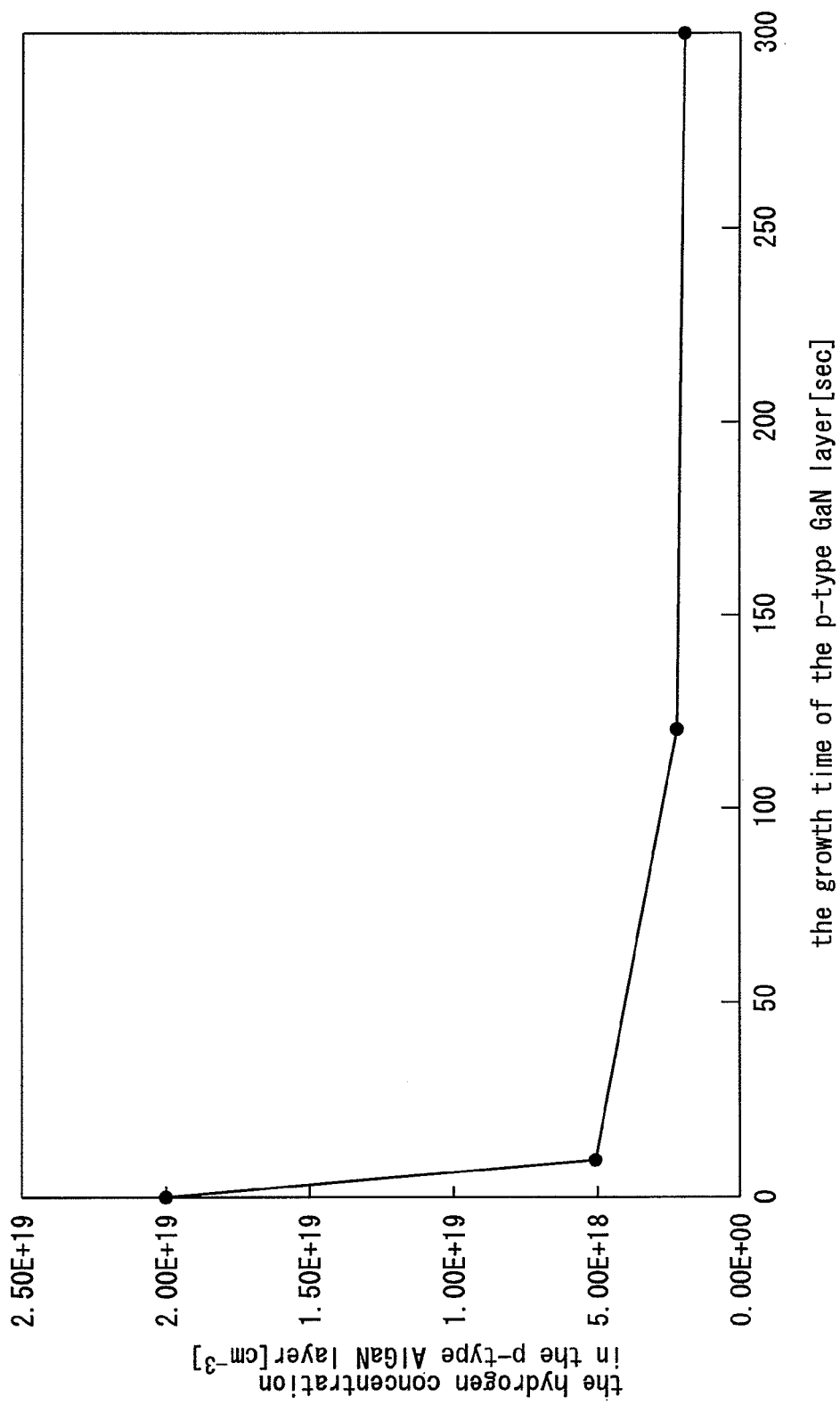
FIG. 10 is the result of measuring the hydrogen concentration in the p-type AlGaN layer by SIMS analysis when the growth time of the p-type GaN layer is changed.

FIG. 10 is the result of measuring the hydrogen concentration in the p-type AlGaN layer by SIMS analysis when the growth time of the p-type GaN layer is changed. At this time, the Mg concentration in the p-type $Al_{0.07}Ga_{0.93}N$ layer 34 is $2\times10^{19}$ $cm^{-3}$. According to this, when the growth time of the p-type GaN layer 36 is 0 sec, that is, when growth is not performed, the hydrogen concentration is $2\times10^{19}$ $cm^{-3}$, which is equal to Mg. In this case, H passivation occurs, so that the activation rate of the p-type impurity decreases and the p-type nitride semiconductor layer having sufficiently low resistivity can not be formed. On the other hand, when the growth time is 10 sec or more, the hydrogen concentration is $5\times10^{18}$ $cm^{-3}$ or less. When the hydrogen concentration is $1\times10^{19}$ $cm^{-3}$ or less, the ratio of the hydrogen concentration to the Mg concentration is 1/2 or less in the p-type AlGaN layer, the hole concentration is $1\times10^{17}$ $cm^{-3}$ or more at room temperature, and the p-type nitride semiconductor layer having sufficiently low resistivity can be formed. Further, it is found that at 120 seconds or more, the hydrogen concentration is $2\times10^{18}$ $cm^{-3}$ or less (the hydrogen concentration/the Mg concentration=1/10 or less). Therefore, the growth time of the p-type GaN layer 36 is desirably 10 seconds or more, and further desirably 120 seconds or more.

The p-type nitride semiconductor layer having sufficiently low resistivity can be formed by the method of this Embodiment. Also, heat treatment for activating the p-type impurity need not be performed after crystal growth, so that the crystallinity is good. Also, as in First Embodiment, the flow velocity of the raw material gases is more than 0.2 m/sec, so that the Mg doping efficiency can be more than 0.3%.

Also, as in First Embodiment, when the p-type GaN layer 36 is formed, a gas mixture of hydrogen gas and nitrogen gas, in which the volume composition ratio of hydrogen gas is x ($0 \leq x \leq 1$) and the volume composition ratio of nitrogen gas is 1-x, is used as the carrier gas. In other words, the carrier gas used when the p-type layer is formed may be any of nitrogen gas alone, a gas mixture of nitrogen gas and hydrogen gas, and hydrogen gas alone.

Also, as in First Embodiment, the growth time of the p-type GaN layer 36 is desirably 10 seconds or more, and further desirably 120 seconds or more. When the p-type GaN layer 36 is formed, the feed molar ratio of the hydrazine derivative to the organic metal compound is desirably 1 or more and less than 20, and further desirably 3 or more and 15 or less. When the p-type GaN layer 36 is formed, the feed molar ratio of ammonia to the hydrazine derivative is desirably 10 or more and less than 1000, and further desirably 20 or more and 500 or less. When the p-type GaN layer 36 is formed, the temperature of the GaN substrate 32 is desirably 800° C. or more and less than 1200° C., and further desirably 900° C. or more and less than 1200° C.

Third Embodiment

Figure 11:
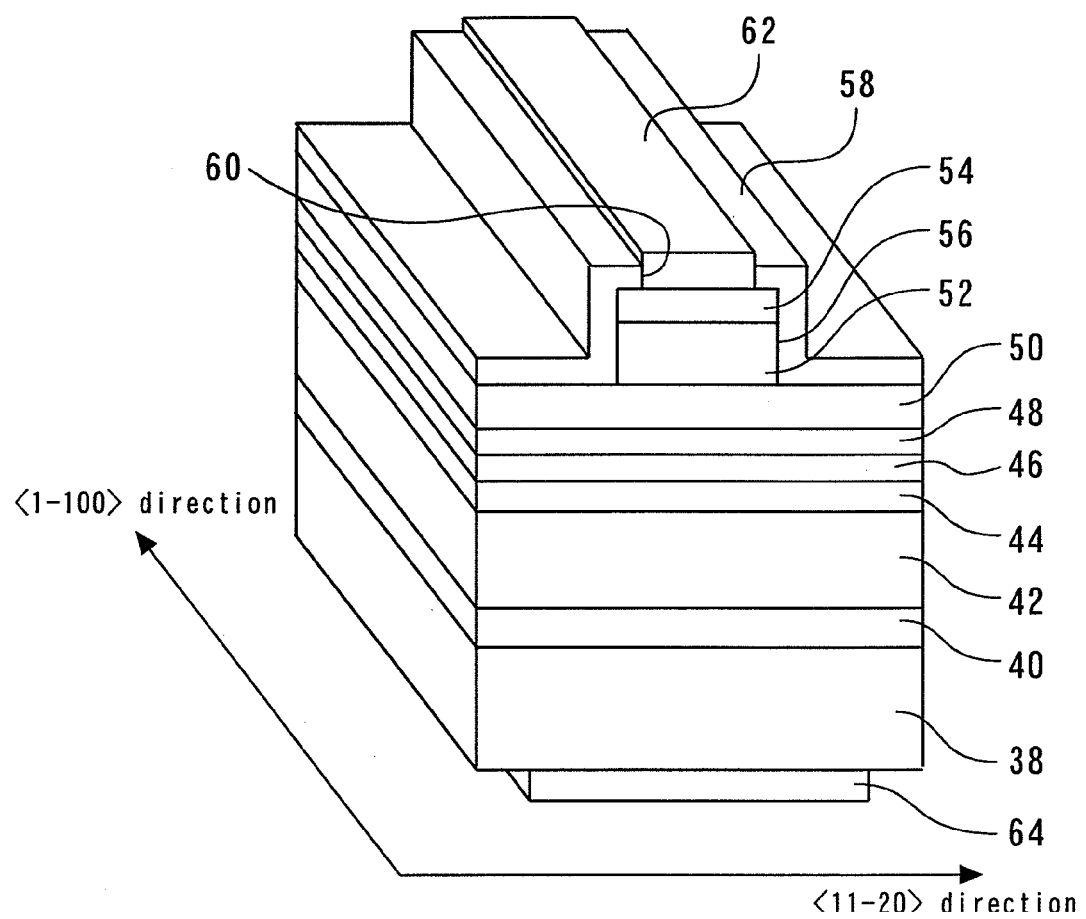
FIG. 11 is a perspective view showing a nitride semiconductor device according to the Third Embodiment of the present invention.

FIG. 11 is a perspective view showing a nitride semiconductor device according to the Third Embodiment of the present invention. This nitride semiconductor device is a ridge waveguide type blue-violet LD. However, the nitride semiconductor device is not limited to this and can also be similarly applied to general blue-violet LDs and a light emitting diode.

An n-type GaN buffer layer 40 having a layer thickness of 1 µm, an n-type $Al_{0.07}Ga_{0.93}N$ clad layer 42 (n-type clad layer) having a layer thickness of 1.0 µm, an n-type GaN light guide layer 44 having a layer thickness of 0.1 µm, an active layer 46, a p-type $Al_{0.2}Ga_{0.8}N$ electron barrier layer 48 having a layer thickness of 0.02 µm, a p-type GaN light guide layer 50 having a layer thickness of 0.1 µm, a p-type $Al_{0.07}Ga_{0.93}N$ clad layer 52 (p-type clad layer) having a layer thickness of 0.4 µm, and a p-type GaN contact layer 54 (p-type contact layer) having a layer thickness of 0.1 µm are formed in order on the (0001) plane, major surface, of an n-type GaN substrate 38 (substrate).

The active layer 46 has a multiple quantum well structure in which $In_{0.12}Ga_{0.88}N$ well layers having a layer thickness of 3.5 nm and GaN barrier layers having a layer thickness of 7.0 nm are alternately laminated in three pairs. The p-type $Al_{0.07}Ga_{0.93}N$ clad layer 52 and the p-type GaN contact layer 54 form a waveguide ridge 56. The waveguide ridge 56 is formed in the center in the width direction of the resonator and extends between both cleavage planes, which are the end faces of the resonator.

A silicon oxide film 58 is disposed on the side walls of the waveguide ridge 56 and the exposed surface of the p-type GaN light guide layer 50. The opening 60 of the silicon oxide film 58 is provided on the upper surface of the waveguide ridge 56, and a surface of the p-type GaN contact layer 54 is exposed through the opening 60. A p-side electrode 62 comprising Pt and Au films is electrically connected to this exposed p-type GaN contact layer 54. An n-side electrode 64, in which a Ti film and an Al film are sequentially laminated by a vacuum deposition method, is formed on the back surface of the n-type GaN substrate 38. The hydrogen concentration in the p-type $Al_{0.07}Ga_{0.93}N$ clad layer 52 is $1\times10^{19}$ $cm^{-3}$ or less, and the carbon concentration of the p-type GaN contact layer 54 is $1\times10^{18}$ $cm^{-3}$ or less.

Next, a method for manufacturing the nitride semiconductor device according to this Embodiment will be described. As the crystal growth method, an MOCVD method is used. As the group III raw material, trimethylgallium (TMG), trimethylaluminum (TMA), and trimethylindium (TMI), organic metal compounds, are used. As the group V raw material, ammonia ($NH_3$) and 1,2-dimethylhydrazine (a hydrazine derivative) are used. As the n-type impurity raw material, monosilane ($SiH_4$) is used, and as the p-type impurity raw material, cyclopentadienyl magnesium ($CP_2Mg$) is used. As the carrier gas for these raw material gases, hydrogen ($H_2$) gas and nitrogen ($N_2$) gas are used.

First, the n-type GaN substrate 38 is placed in the reaction furnace of the MOCVD apparatus in FIG. 2 or FIG. 8, and then, the temperature of the n-type GaN substrate 38 is increased to 1000° C., while ammonia is fed. Next, the feed of TMG and monosilane is started to form the n-type GaN buffer layer 40 on the major surface of the n-type GaN substrate 38. Next, the feed of TMA is started to form the n-type $Al_{0.07}Ga_{0.93}N$ clad layer 42. Next, the feed of TMA is stopped to form the n-type GaN light guide layer 44. Next, the feed of TMG and monosilane is stopped, and the temperature of the n-type GaN substrate 38 is decreased to 700° C.

Next, TMG, TMI, and ammonia are fed to form the $In_{0.12}Ga_{0.88}N$ well layer. Then, TMI is stopped, and TMG and ammonia are fed to form the GaN barrier layer. By alternately laminating these in three pairs, the active layer 46 having a multiple quantum well (MQW) structure is formed.

Next, the temperature of the n-type GaN substrate 38 is again increased to 1000° C., while ammonia is fed. Then, TMG, TMA, and $CP_2Mg$ are fed to form the p-type $Al_{0.2}Ga_{0.8}N$ electron barrier layer 48 on the major surface of the n-type GaN substrate 38. Next, the feed of TMA is stopped to form the p-type GaN light guide layer 50.

Next, the feed of TMA is started again, and TMG at a flow rate of $2.4\times10^{-4}$ mol/min, TMA at a flow rate of $1.4\times10^{-5}$ mol/min, $CP_2Mg$ at a flow rate of $3.0\times10^{-7}$ mol/min, and ammonia as the group V raw material are each fed to form the p-type $Al_{0.07}Ga_{0.93}N$ clad layer 52. The carbon concentration of this p-type $Al_{0.07}Ga_{0.93}N$ clad layer 52 is $1\times10^{18}$ $cm^{-3}$ or less.

Next, the feed of TMA is stopped, and with the carrier gas, 1,2-dimethylhydrazine at a flow rate of $5.6\times10^{-4}$ mol/min, in addition to TMG at a flow rate of $1.2\times10^{-4}$ mol/min, $CP_2Mg$ at a flow rate of $9.0\times10^{-7}$ mol/min, and ammonia at a flow rate of $4.5\times10^{-2}$ mol/min as the group V raw material are each fed to form the p-type GaN contact layer 54. The flow velocity of the raw material gases comprising the group III raw material, the group V raw material, and the p-type impurity raw material, during the formation of this p-type GaN contact layer 54, is 0.25 m/sec.

Next, the feed of TMG and $CP_2Mg$ is stopped, and cooling to about 300° C. is performed while the group V raw material is fed. When the feed of TMG and $CP_2Mg$ is stopped, ammonia may also be stopped, and cooling to about 300° C. may be performed while only 1,2-dimethylhydrazine is fed as the group V raw material.

Next, a resist is applied on the entire surface of the wafer on which crystal growth is completed, and a resist pattern corresponding to the shape of a mesa-like portion is formed by lithography. Using this resist pattern as a mask, and by a reactive ion etching (RIE) method, the p-type $Al_{0.07}Ga_{0.93}N$ clad layer 52 is removed, or etching is performed to the degree that the p-type $Al_{0.07}Ga_{0.93}N$ clad layer 52 is slightly left. The waveguide ridge 56, which provides an optical waveguide structure, is formed by this etching. As the RIE etching gas, for example, a chlorine-based gas is used.

Next, with the resist pattern left, the silicon oxide film 58 having a film thickness of 0.2 µm is formed on the entire surface on the n-type GaN substrate 38 by, for example, a CVD method, a vacuum deposition method, or a sputtering method. Then, the silicon oxide film 58 on the waveguide ridge 56 is removed by the so-called lift-off method, simultaneously with the removal of the resist pattern. Thus, the opening 60 is formed in the silicon oxide film 58 on the waveguide ridge 56.

Next, the Pt and Au films are sequentially formed on the entire surface on the n-type GaN substrate 38 by, for example, a vacuum deposition method, then, the resist is applied, and the p-side electrode 62 is formed by lithography and wet etching or dry etching.

Next, the Ti film and the Al film are sequentially formed on the entire back surface of the n-type GaN substrate 38 by the vacuum deposition method, and alloy treatment for bringing the n-side electrode 64 into Ohmic contact with the n-type GaN substrate 38 is performed.

Next, the n-type GaN substrate 38 is processed into the shape of a bar by cleavage or the like to form both end faces of the resonator. Then, coating is provided on the end faces of the resonator, and then, the bar is cleavaged into the shape of a chip to manufacture the nitride semiconductor device according to this Third Embodiment.

In this Embodiment, ammonia and the hydrazine derivative are used as the group V raw material to form the p-type GaN contact layer 54, and only ammonia is used as the group V raw material to form the p-type $Al_{0.07}Ga_{0.93}N$ clad layer 52. Thus, as in Second Embodiment, the p-type nitride semiconductor layer having sufficiently low resistivity can be formed. Also, heat treatment for activating the p-type impurity need not be performed after crystal growth, so that the crystallinity is good. Also, as in Embodiments 1 and 2, the flow velocity of the raw material gases is more than 0.2 m/sec, so that the Mg doping efficiency can be more than 0.3%.

Also, as in First Embodiment, when the p-type GaN contact layer 54 is formed, a gas mixture of hydrogen gas and nitrogen gas, in which the volume composition ratio of hydrogen gas is x ($0 \leq x \leq 1$) and the volume composition ratio of nitrogen gas is 1-x, is used as the carrier gas. In other words, the carrier gas used when the p-type layer is formed may be any of nitrogen gas alone, a gas mixture of nitrogen gas and hydrogen gas, and hydrogen gas alone.

Also, as in First Embodiment, the growth time of the p-type GaN contact layer 54 is desirably 10 seconds or more, and further desirably 120 seconds or more. When the p-type GaN contact layer 54 is formed, the feed molar ratio of the hydrazine derivative to the organic metal compound is desirably 1 or more and less than 20, and further desirably 3 or more and 15 or less. When the p-type GaN contact layer 54 is formed, the feed molar ratio of ammonia to the hydrazine derivative is desirably 10 or more and less than 1000, and further desirably 20 or more and 500 or less. When the p-type GaN contact layer 54 is formed, the temperature of the n-type GaN substrate 38 is desirably 800° C. or more and less than 1200° C., and further desirably 900° C. or more and less than 1200° C.

In Embodiments 1 to 3, a substrate, such as a sapphire, SiC, or Si wafer, may be used instead of the GaN substrates 10 and 32 and the n-type GaN substrate 38. Triethylgallium (TEG) may be used instead of TMG. As the hydrazine derivative, 1,1-dimethylhydrazine may be used instead of 1,2-dimethylhydrazine.

Also, $In_xAl_yGa_{1-x-y}N$ layer ($0 \leq x \leq 1, 0 \leq y \leq 1$) may be used instead of the p-type $Al_{0.07}Ga_{0.93}N$ layer 34, the p-type GaN layers 12 and 36, the p-type $Al_{0.07}Ga_{0.93}N$ clad layer 52, or the p-type GaN contact layer 54. However, as described in Second Embodiment, the most effective is the case where the lower p-type nitride semiconductor layer is an AlGaN layer, and the upper p-type nitride semiconductor layer is a GaN layer.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-243890, filed on Sep. 24, 2008 and a Japanese Patent Application No. 2009-103092, filed on Apr. 21, 2009 including specification, claims, drawings and summary, on which the Convention priority of the present application is based, are incorporated herein by reference in its entirety.

What is claimed is:

1. A method for manufacturing a nitride semiconductor device, comprising forming a p-type nitride semiconductor layer, on a substrate, in a reaction furnace, from an organic metal compound as a group III element source material, ammonia and a hydrazine derivative as group V element source materials, and a Mg source material gas as a p-type impurity source material, wherein flow velocity of the source material gases, comprising the group III element source material, the group V element source materials, and the p-type impurity source material, in the reaction furnace, is more than 0.2 m/sec.

2. A method for manufacturing a nitride semiconductor device, comprising:
    forming a first p-type nitride semiconductor layer, on a substrate, from an organic metal compound as a group III element source material, ammonia as a group V element source material, and a p-type impurity source material; and
    forming a second p-type nitride semiconductor layer on the first p-type nitride semiconductor layer, in a reaction furnace, from an organic metal compound as a group III element source material, ammonia and a hydrazine derivative as group V element source materials, and a Mg source material gas as a p-type impurity source material, wherein, in forming the second p-type nitride semiconductor layer, flow velocity of the source material gases, comprising the group III element source material, the group V element source materials, and the p-type impurity source material, in a reaction furnace, is more than 0.2 m/sec.

3. The method for manufacturing a nitride semiconductor device according to claim 2, wherein
    the first p-type nitride semiconductor layer is AlGaN, and
    the second p-type nitride semiconductor layer is GaN.

4. A method for manufacturing a nitride semiconductor device, comprising:
    forming an n-type cladding layer on a substrate;
    forming an active layer on the n-type cladding layer;
    forming a p-type cladding layer on the active layer, from an organic metal compound as a group III element source material, ammonia as a group V element source material, and a p-type impurity source material; and
    forming a p-type contact layer on the p-type cladding layer, in a reaction furnace, from an organic metal compound as a group III element source material, ammonia and a hydrazine derivative as group V element source materials, and a Mg source material gas as a p-type impurity source material, wherein, in forming the p-type contact layer, flow velocity of the source material gases, comprising the group III element source material, the group V element source materials, and the p-type impurity source material, in a reaction furnace, is more than 0.2 m/sec.

5. The method for manufacturing a nitride semiconductor device according to claim 4, wherein
    the p-type cladding layer is AlGaN, and
    the p-type contact layer is GaN.

6. The method for manufacturing a nitride semiconductor device according to claim 1, wherein the group V element source material, and the p-type impurity source material are separately introduced into the reaction furnace near the substrate.

7. The method for manufacturing a nitride semiconductor device according to claim 1, wherein the flow velocity of the source material gases in the reaction furnace is less than 1 m/sec.

8. The method for manufacturing a nitride semiconductor device according to claim 2, wherein, in forming the second p-type nitride semiconductor layer, the flow velocity of the source material gases in the reaction furnace is less than 1 m/sec.

9. The method for manufacturing a nitride semiconductor device according to claim 4, wherein, in forming the p-type contact layer, the flow velocity of the source material gases in the reaction furnace is less than 1 m/sec.

10. The method for manufacturing a nitride semiconductor device according to claim 1, wherein the hydrazine derivative is 1,2-dimethylhydrazine.

11. The method for manufacturing a nitride semiconductor device according to claim 3, wherein the hydrazine derivative is 1,2-dimethylhydrazine.

12. The method for manufacturing a nitride semiconductor device according to claim 4, wherein the hydrazine derivative is 1,2-dimethylhydrazine.

* * * * *